United States Patent [19]

Ohkura et al.

[11] Patent Number: 5,238,785
[45] Date of Patent: Aug. 24, 1993

[54] METHOD OF MANUFACTURING A DIFFRACTION GRATING FOR A SEMICONDUCTOR LASER

[75] Inventors: Yuji Ohkura; Masatoshi Fujiwara, both of Itami, Japan

[73] Assignee: Mitsubishi Denki Kabushiki Kaisha, Tokyo, Japan

[21] Appl. No.: 568,889

[22] Filed: Aug. 17, 1990

[30] Foreign Application Priority Data

Aug. 18, 1989 [JP] Japan .................................. 1-213553
Jun. 4, 1990 [JP] Japan .................................. 2-146976
Jul. 17, 1990 [JP] Japan .................................. 2-189840

[51] Int. Cl.⁵ .......................... G03C 5/00; G02B 5/18
[52] U.S. Cl. .................................. 430/321; 430/323; 430/329; 430/396; 359/566; 359/569; 359/577
[58] Field of Search .............. 430/299, 321, 322, 323, 430/325, 329, 331, 396; 350/162.17, 162.2, 163

[56] References Cited

U.S. PATENT DOCUMENTS

| 4,366,235 | 12/1982 | Land ................................. 430/322 |
| 4,782,035 | 11/1988 | Fujiwara ........................... 437/129 |
| 4,826,291 | 5/1989 | Utaka et al. ..................... 430/299 |
| 4,847,857 | 7/1989 | Ohkura ............................. 372/96 |
| 5,004,673 | 4/1991 | Vlannes ............................ 430/299 |

FOREIGN PATENT DOCUMENTS 60-191209 9/1985 Japan .
2-28984 1/1990 Japan .

OTHER PUBLICATIONS

"λ/4 Shift Diffraction Grating Using Novolak Series Negative/Positive Resist", 2a-N-9, Prescript of Autumn Meeting, 1985, Japanese Association of Applied Physics.
"Production of λ/4 Shift Diffraction Grating Using Phase Shift Film", 29p-T-8, Prescript of Autumn Meeting, 1986, Japanese Association of Applied Physics.
"20-DFB Laser Arrays Fabricated by SOR Lithography", IOOC 1989, 21D3-1, Nakao et al.
Streifer et al., "Coupling Coefficients For Distributed Feedback Single- and Double-Heterostructure Diode Lasers", IEEE Journal of Quantum Electronics, vol. QE-11, 1975, pp. 867-873.
Johnson, "Optical Writing Of Dense 1000-Å Features In Photoresists", Applied Optics, vol. 21, No. 11, 1982, p. 1892.

Primary Examiner—Marion E. McCamish
Assistant Examiner—Kathleen Duda
Attorney, Agent, or Firm—Leydig, Voit & Mayer

[57] ABSTRACT

A method for manufacturing a diffraction grating includes applying a resist, the developing speed of which has an extreme at a certain exposure intensity, to a substrate on which the diffraction grating is to be formed, performing interference exposure of the resist with maximum and minimum values of exposure intensity respectively larger and smaller than the intensity which makes the developing speed an extreme, developing the resist, and etching the substrate using the remaining resist as a mask.

12 Claims, 8 Drawing Sheets

FIG. 1(a)

INTERFERENCE EXPOSURE

INTERFERENCE EXPOSURE

METHOD OF MANUFACTURING A DIFFRACTION GRATING FOR A SEMICONDUCTOR LASER

FIELD OF THE INVENTION

The present invention relates to a method for manufacturing a diffraction grating and to a single wavelength oscillating semiconductor laser and, more particularly, to a method for manufacturing a diffraction grating, two different periods formed at the same time and to a single wavelength oscillating semiconductor laser having high linearity between beam output and injected current and a highly stable wavelength oscillation.

BACKGROUND OF THE INVENTION

Figure 7:
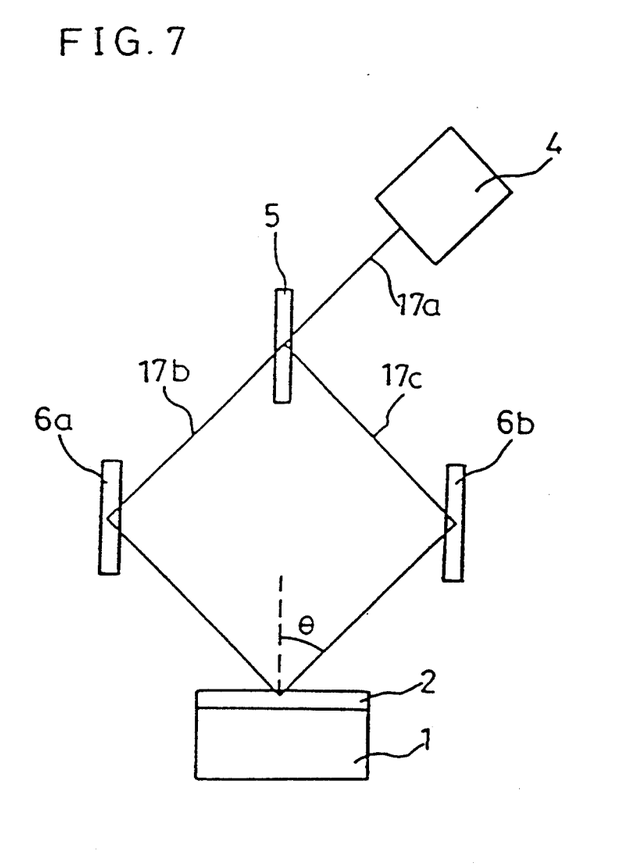
FIG. 7 is a view showing an interference exposure apparatus.

FIG. 7 is a view showing an interference exposure apparatus used for manufacturing a conventional diffraction grating. Referring to FIG. 7, a laser beam 17a is output from a laser beam source 4. The laser beam 17a is divided into laser beams 17b and 17c by a half mirror 5 and the laser beams 17b and 17c are reflected by mirrors 6a and 6b, respectively and then applied to a resist 2 on a substrate 1.

Figure 8A:
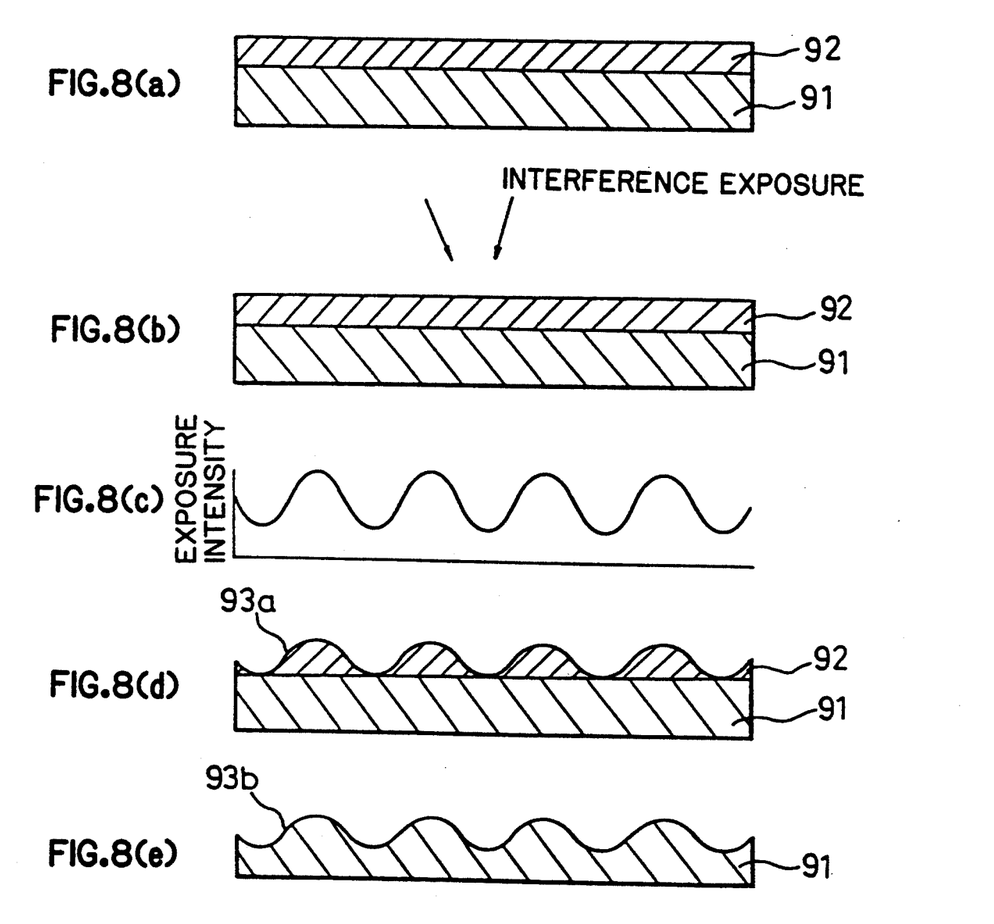

FIGS. 8(a), 8(b), 8(d), and 8(e) are cross-sectional views showing conventional manufacturing steps of a diffraction grating by an interference exposure method and FIG. 8(c) is a diagram showing a distribution of exposure intensity.

Next, the conventional manufacturing steps of the diffraction grating will be described in reference to FIGS. 8(a)-8(e).

First, referring to FIG. 8(a), a resist 92 is applied to a substrate 91. Then, referring to FIG. 8(b), the resist 92 is exposed by a two-beam interference exposure method. Referring to FIG. 8(c), the exposure intensity of a laser beam applied to the resist 92 varies periodically. Then, referring to FIG. 8(d), when the exposed resist 92 is developed, the resist 92 is patterned and a diffraction grating 93a is formed. Thereafter, referring to FIG. 8(e), the substrate 91 is etched away using the patterned resist 92 as a mask and then a diffraction grating 93b is formed.

Then, a principle of the interference exposure method used for manufacturing the conventional diffraction grating will be described in reference to FIG. 7.

According to the device shown in FIG. 7, the laser beam 17a output from the laser beam source 4 is divided into two by the half mirror 5 and reflected by the mirrors 6a and 6b and meet again on the substrate 1. At this time, intensity of the beam on the substrate has the distribution of a period $\Lambda$ because of interference of the laser beam. The period $\Lambda$ is represented by:

$$\Lambda = \frac{\lambda}{2 \sin \theta} \quad (1)$$

where $\lambda$ is a wavelength of the laser beam and $\theta$ is the incident angle of the laser beam on the substrate.

The conventional diffraction grating is formed using the above principle, in which the resist applied to the substrate is exposed with a period $\Lambda$ and then the resist is developed and then the substrate is etched away using the patterned resist as a mask.

Figure 9:
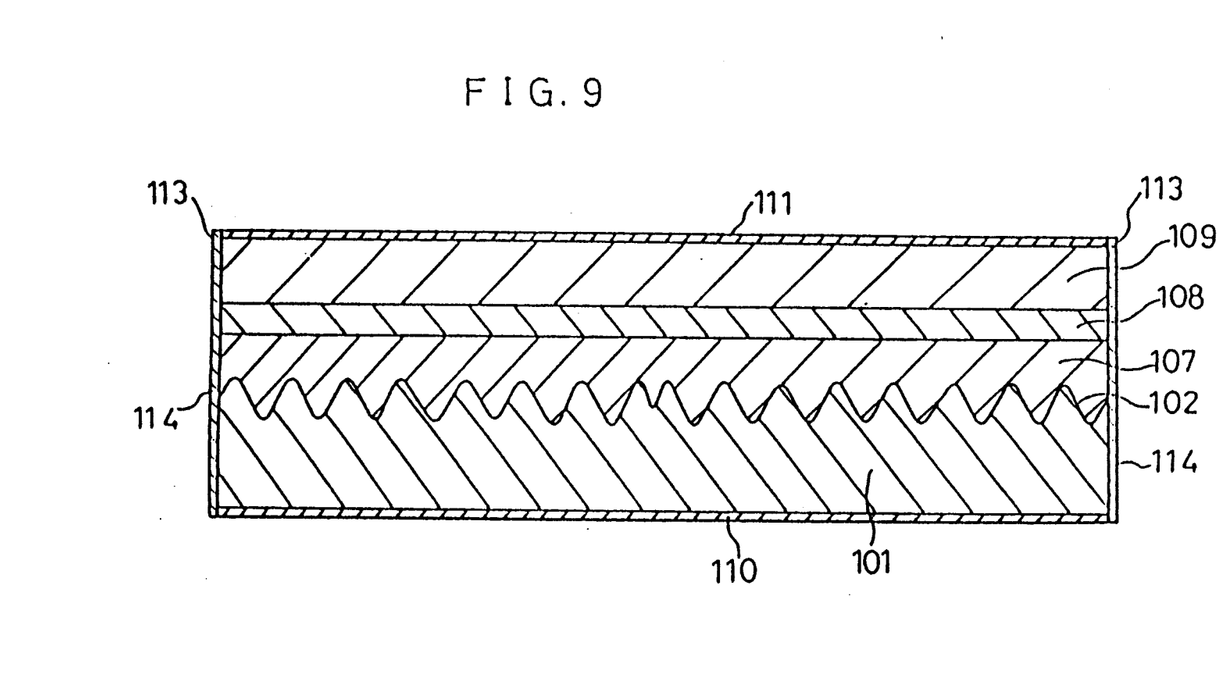
FIG. 9 is a sectional view showing a conventional single wavelength oscillating semiconductor laser device.

FIG. 9 is a sectional view showing a conventional single wavelength semiconductor laser device disclosed in Optics Vol. 15, No 2, pp.115-121. In FIG. 9, an n type InGaAsP guide layer 107, an InGaAsP active layer 108 and a p type InP layer 109 are sequentially formed on an n type InP substrate 101 in which a diffraction grating 102 having a phase shift region in the center thereof is formed. An n side electrode 110 is provided on a back surface of the substrate 101 and a p side electrode 111 is provided on the p type InP layer 109. In addition, a nonreflective coating film 113 is provided on each end surface 114 of the laser.

Next, operation thereof will be described. In the semiconductor laser device, electrons in the n type InP substrate 101 and holes in the p type InP layer 109 are both injected into the InGaAsP active layer 108 and then emissive recombination occurs. In a distributed feedback (DFB) laser device having the diffraction grating 102 having the phase shift region in an active region, the light generated by the emissive recombination is reflected by the diffraction grating 102 and goes and returns in an element, whereby a laser is oscillated.

Since the diffraction grating 102 effectively reflects a beam having a wavelength $\lambda$ where $\lambda = 2 n_{eff} \Lambda/n$ ($n_{eff}$ is equivalent refractive index, $\Lambda$ is the period of the diffraction grating and n is an integer), the oscillation wavelength is the wavelength whose gain is largest in the active region among wavelengths represented by 2 $n_{eff} \lambda/n$. As for the oscillation wavelength $\lambda$, when $n = 1$, the diffraction grating is called a primary diffraction grating and when $n = 2$, the diffraction grating is called a secondary diffraction grating.

According to the single wavelength oscillating semiconductor laser device having the structure shown in FIG. 9, since the beam is reflected only by the diffraction grating 102 in the active region and then confined in the element, beam density in the center of the element is increased. As a result, the linearity between beam output and an injected current and the stability of single wavelength oscillation are reduced by hole burning or the like.

As described above, according to the conventional method for manufacturing a diffraction grating, it is not possible to form a diffraction grating having a period which is a half of the wavelength $\lambda$ of the laser beam source 4 or less.

In addition, according to the conventional single wavelength oscillating semiconductor laser, the linearity of the beam output relative to injected current and stability of the single wavelength oscillation is reduced under an influence of the hole burning or the like.

SUMMARY OF THE INVENTION

The present invention is directed to solving the above problems and has for its object providing a method for manufacturing a diffraction grating, by which a diffraction grating with a short period can be formed.

It is another object of the present invention to provide a single wavelength oscillating semiconductor laser device having high linearity between beam output and injected current and stability of single wavelength oscillation.

It is a further object of the present invention to provide a method for manufacturing a diffraction grating, by which diffraction gratings having two different periods can be formed on the same plane by one interference exposure at the same time.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

A method for manufacturing a diffraction grating of the present invention comprises the steps of applying a resist, which has an extreme developing speed at a certain exposure intensity, to a substrate on which the diffraction grating is to be formed, performing interference exposure with a beam intensity in which the maximum and minimum values of exposure intensity are respectively larger and smaller than the intensity that produces an extreme developing speed and etching the substrate using a pattern, which is obtained by developing the resist, as a mask. As a result, a diffraction grating pattern having a period which is a half of an interference fringe obtained by an interference exposure method can be provided.

In addition, according to a single wavelength oscillating semiconductor laser device of the present invention, the order of a diffraction grating in the center of an element is higher than that of a diffraction grating in the neighborhood of resonator facets. Therefore, beam density can be prevented from being increased in the center of the element and excellent linearity between beam output and injected current and a highly stable single wavelength oscillation can be obtained.

In addition, a method for manufacturing a diffraction grating of the present invention comprises the steps of applying a resist, which has an extreme developing speed at a certain exposure intensity, to a substrate on which the diffraction grating is to be formed, partially covering the resist with a semi-transparent mask, performing interference exposure with a beam intensity in which the maximum and minimum values of exposure intensity are respectively larger and smaller than the intensity that produces an extreme developing speed in either a portion covered with the semi-transparent mask or another portion and etching the substrate using a pattern, which is obtained by developing the resist, as a mask. As a result, two kinds of diffraction gratings having different periods can be formed by one interference exposure at the same time.

BRIEF DESCRIPTION OF THE DRAWINGS

FIGS. 3(a), 3(b), and 3(e) are cross-sectional views showing manufacturing steps of a diffraction grating in accordance with a third embodiment of the present invention

FIGS. 8(a), 8(d), and 8(e) are cross-sectional views showing manufacturing steps of a diffraction grating by a conventional interference exposure method and FIG. 8(c) is a diagram showing a distribution of exposure intensity.

DETAILED DESCRIPTION OF PREFERRED EMBODIMENTS

A method for manufacturing a diffraction grating in accordance with the present invention will be described in detail hereinafter in reference to the drawings.

Figure 1A:
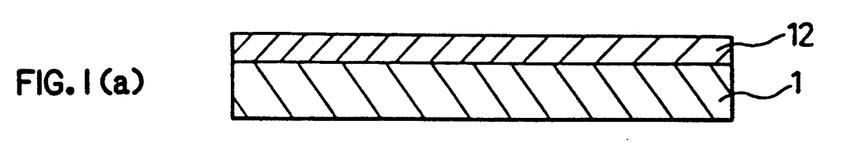
FIGS. 1(a), 1(b), 1(d), and 1(e) are cross-sectional views showing manufacturing steps of a diffraction grating in accordance with a first embodiment of the present invention
Figure 1B:
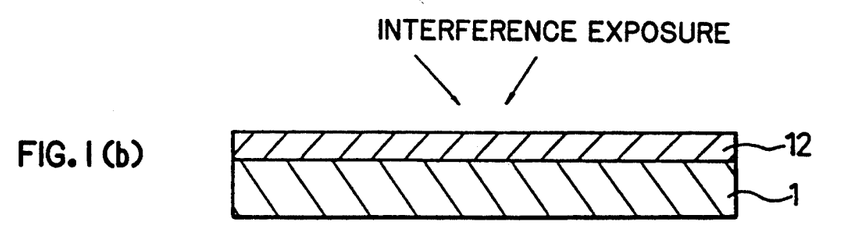
Figure 1C:
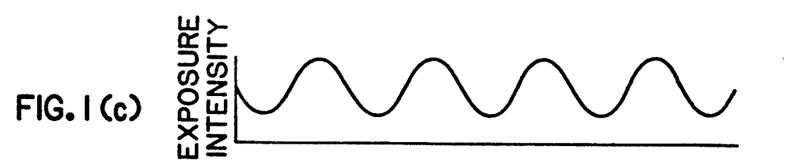
FIG. 1(c) is a diagram showing a distribution of exposure intensity.
Figure 1D:
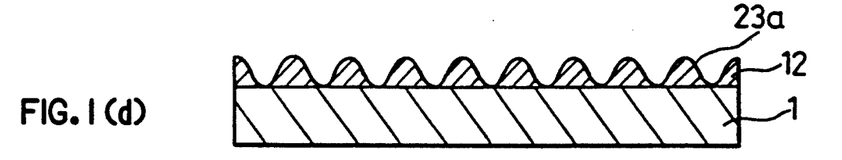
Figure 1E:
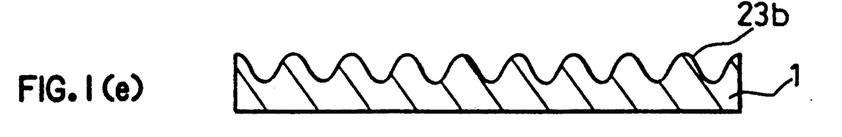

FIGS. 1(a), 1(b), 1(d) and 1(e) are cross-sectional views showing manufacturing steps of a diffraction grating in accordance with a first embodiment of the present invention and FIG. 1(c) is a diagram showing a distribution of exposure intensity In FIG. 1(a), a resist 12 (image reversible resist), of which developing speed has a minimum value in regard to certain exposure intensity, is applied to a substrate 1.

Next, the manufacturing steps of the diffraction grating in accordance with this embodiment will be described in detail hereinafter.

First, referring to FIG. 1(a), the resist (image reversible resist) 12, which is baked at a temperature of 110° to 120° C. before exposure so that the developing speed may have the minimum value in regard to certain exposure intensity, is applied to the substrate 1 where the diffraction grating is to be formed. Then, it is baked at a temperature of 110° to 120° C. for five minutes. Then, referring to FIG. 1(b), the resist 12 is exposed by a two-beam interference exposure method with an exposure intensity which has maximum and minimum values on both sides of the intensity, i.e., of higher and lower intensity, which makes the developing speed a minimum value. FIG. 1(c) is a diagram showing the distribution of the beam intensity at this time. Then, referring to FIG. 1(d), the resist 12 is developed so that the resist 12 at portions exposed with the beam intensity which makes the developing speed a minimum value are left and patterned to form a diffraction grating 23a. Then, referring to FIG. 1(e), the substrate 1 is etched away with an appropriate etchant such as an HBr/HNO₃/H₂O solution, an HBr/HNO₃/CH₂OH solution or a Br₂/CH₂OH solution using the patterned resist 12 as a mask to form a diffraction grating 23b.

Next, operation of the resist (image reversible resist) in which the developing speed has a minimum value for a certain exposure intensity will be described hereinafter.

Figure 5:
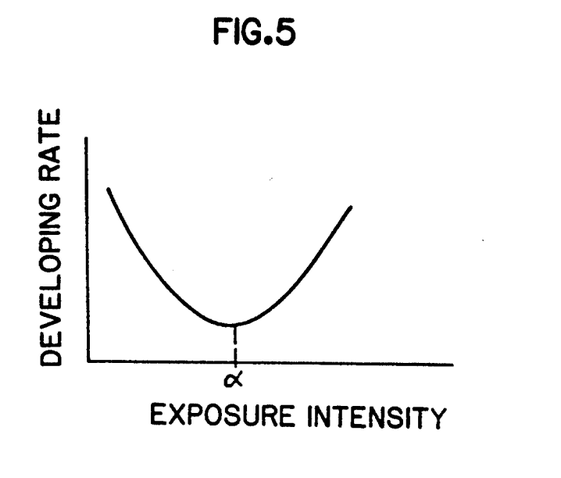
FIG. 5 is a diagram showing the relation between exposure intensity and developing speed of an image reversible resist after it is baked at a temperature of 110° to 120° C.

It is known that when the image reversible resist is baked at a temperature of 110° to 120° C. before exposure, the developing speed has the minimum value in regard to an exposure intensity of $a$ as shown in FIG. 5 (referring to "Electron Material", June, 1986).

Figure 6:
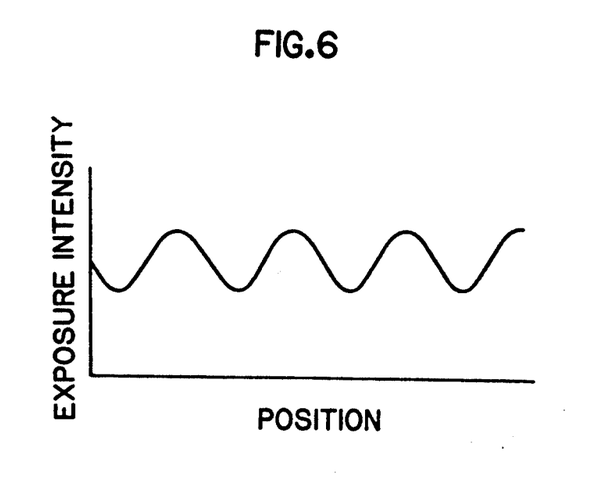
FIG. 6 is a diagram showing a distribution of exposure intensity in an interference exposure method.

Meanwhile, the exposure intensity by the interference exposure method has cyclic distribution as shown in FIG. 6. The period of the distribution is $\Lambda$ in the above equation (1).

Therefore, when the resist is exposed so that the maximum value of the exposure intensity in the interference exposure is more than the point where the developing speed has the minimum value (a point α in FIG. 5) and the minimum value of the exposure intensity is less than the point α, the resist is developed so that the resist at portions exposed with the intensity which makes the developing speed a minimum value are left. As a result, after etching, it is possible to form a diffraction grating having a period which is a half of the period of an interference fringe obtained by the interference exposure method.

Although a description was given of the resist in which developing speed had the minimum value in regard to certain exposure intensity in the above embodiment, the same effect can be attained even if the resist developing speed has a maximum value for a certain exposure intensity.

Next, a single wavelength oscillating semiconductor laser device in accordance with the present invention will be described in detail in reference to the drawings.

Figure 2:
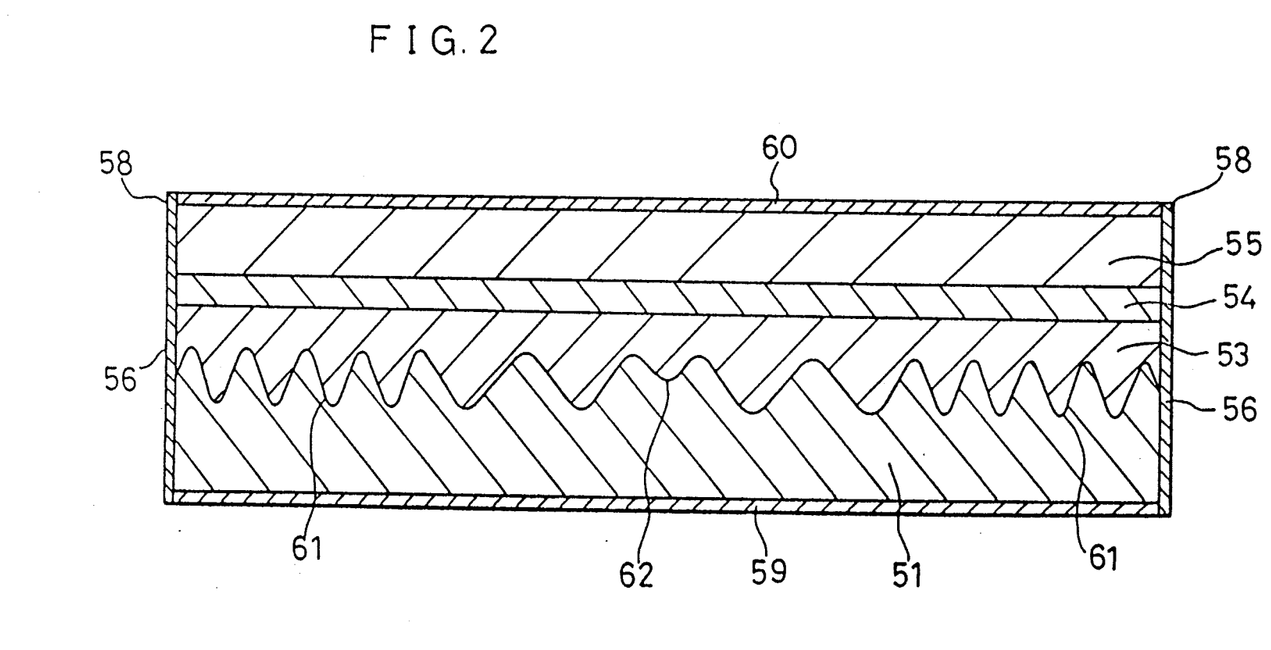
FIG. 2 is a cross-sectional view showing a single wavelength oscillating semiconductor laser device in accordance with a second embodiment of the present invention.

FIG. 2 is a cross-sectional view showing a single wavelength oscillating semiconductor laser device in accordance with a second embodiment of the present invention. In FIG. 2, an n type InGaAsP guide layer 53, an InGaAsP active layer 54 and a p type InP cladding layer 55 are sequentially formed on an n type InP substrate 51 where a primary diffraction grating 61 and a secondary diffraction grating 62 are formed, the latter having a phase shift region in the center thereof. An n side electrode 59 is provided on a back surface of the substrate 51 and a p side electrode 60 is provided on the p type InP layer 55. A nonreflective coating film 58 is provided on both facets of laser.

Next, operation of the single wavelength oscillating semiconductor laser in accordance with this embodiment will be described.

A beam is more effectively reflected by a low ordered diffraction grating. Therefore, as shown in FIG. 2, when the order of the diffraction grating 62 in the center of the element is higher than that of the diffraction grating 61 in the neighborhood of resonator facets, the reflection intensity of the beam in the center of the element is less than that in the neighborhood of the resonator facets. As a result, the beam generated at the active layer 54 is not confined only to the center of the element. Most beams advance to the neighborhood of the resonator facets and are reflected by the diffraction grating 61. Therefore, beam density is not high only in the center of the element and can be uniform over the whole element, with the result that hole burning is not likely to occur and then it is possible to provide a single wavelength oscillating semiconductor laser device having a high linearity between output and injected current and high stability in a single wavelength oscillation. In addition, the laser beam can be output perpendicular to the substrate by the secondary diffraction grating 62 in this laser device.

Meanwhile, according to the conventional method for manufacturing the diffraction grating shown in FIG. 8, since the diffraction grating having the same period is formed over the whole surface of the substrate, it is not possible to form the semiconductor laser having the primary and secondary diffraction gratings shown in FIG. 2.

According to a method for manufacturing a diffraction grating in accordance with the present invention, the diffraction grating having two different periods can be formed on the same plane surface by one interference exposure at the same time.

This method for manufacturing the diffraction grating in accordance with the third embodiment of the present invention will be described hereinafter in reference to the drawing.

Figure 3A:
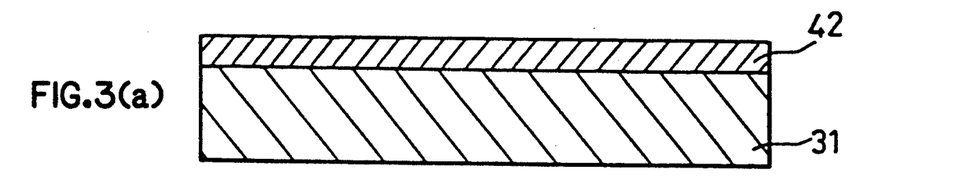
FIG. 3(a) is a diagram showing a distribution of exposure intensity.
Figure 3B:
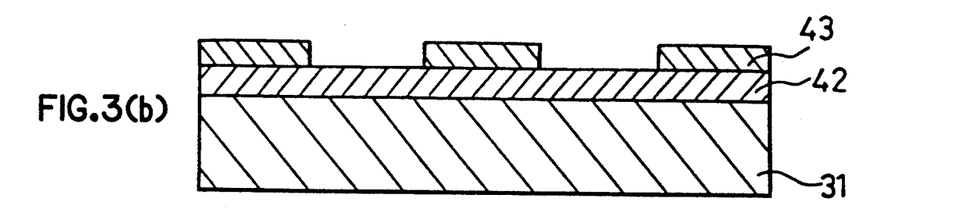
Figure 3C:
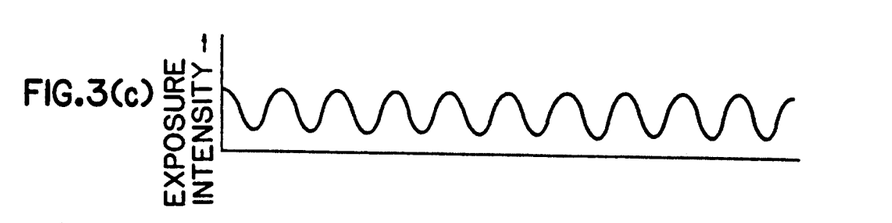
Figure 3D:
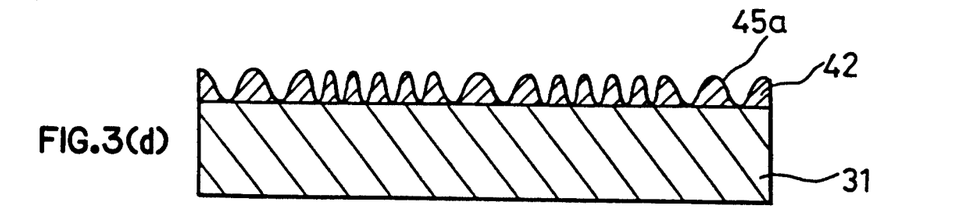
Figure 3E:
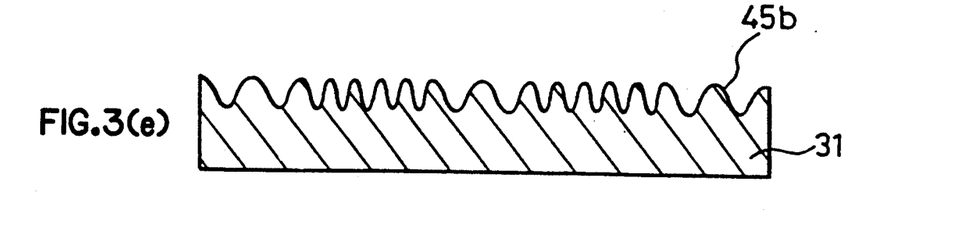

FIGS. 3(a), 3(b), 3(d), and 3(e) are cross-sectional views showing manufacturing steps of a diffraction grating in accordance with a third embodiment of the present invention and FIG. 3(c) is a diagram showing a distribution of beam intensity. In FIG. 3(b), a resist (image reversible resist) 42, of which developing speed has a minimum value at a certain exposure intensity, is applied to a substrate 31 and then a semi-transparent mask 43 is disposed on parts of the resist 42.

The manufacturing steps of the diffraction grating in accordance with the embodiment will be described hereinafter.

First, referring to FIG. 3(a), the resist (image reversible resist) 42, which is baked at a temperature of 110° to 120° C. before exposure so that developing speed may have a minimum value for a certain exposure intensity, is applied to the substrate 31 where the diffraction grating is to be formed. Then, it is baked at a temperature of 110° to 120° C. for five minutes. Then, referring to FIG. 3(b), the semi-transparent mask 43 is disposed on parts of the resist 42. By a two-beam interference exposure method, the resist 42 is exposed, with an exposure intensity having maximum and minimum values on both sides of the intensity, i.e., of higher and lower intensity, which makes the developing speed a minimum value, in the portion of the resist 42 which is not covered with the semi-transparent mask 43. The resist 42 is exposed with an exposure intensity in which the maximum value of the exposure intensity is less than the intensity which makes the developing speed a minimum value in the portion of resist 42 covered with the semi-transparent mask 43. FIG. 3(c) is a diagram showing the distribution of the beam intensity at this time. Then, referring to FIG. 3(d), the resist 42 is developed so that the resist 42 at portions exposed with the beam intensity which makes the developing speed a minimum value are left and patterned to form a diffraction grating 45a. Then, referring to FIG. 3(e), the substrate 31 is etched away with appropriate etchant such as a $HBr/HNO_3/H_2O$ solution, a $HBr/HNO_3/CH_2OH$ solution or a $Br_2/CH_2OH$ solution using the patterned resist 42 as a mask to form a diffraction grating 45b.

As described above, when the image reversible resist is exposed so that the maximum value of the exposure intensity is more than the point where the developing speed has a minimum value (a point α in FIG. 5) and the minimum value of the exposure intensity is less than the point α, the resist is developed so that the resist at portions exposed with the intensity which makes the developing speed a minimum are left. As a result, after etching, it is possible to form the diffraction grating having a period which is a half of the period of an interference fringe obtained by the interference exposure method.

Meanwhile, when the maximum value of the exposure intensity by the interference exposure is less than the point of α or the minimum value of the exposure intensity is more than the point of α, the resist has an interference fringe with the period of the interference exposure.

Therefore, in a case where a part of the substrate is covered with the semi-transparent mask, when the maximum value of the exposure intensity in a portion which is not covered with the mask is more than the point of α and the minimum value thereof is less than the point of α and the maximum value of the exposure intensity in a portion covered with the mask is less than the point of α, it is possible to form diffraction gratings having periods of Λ and Λ/2 in one interference exposure at the same time.

Next, a description will be given of manufacturing steps of a semiconductor laser device shown in FIG. 4, which has primary and secondary diffraction gratings like the semiconductor laser device shown in FIG. 2 using the method for manufacturing the diffraction grating in accordance with this embodiment.

Figure 4:
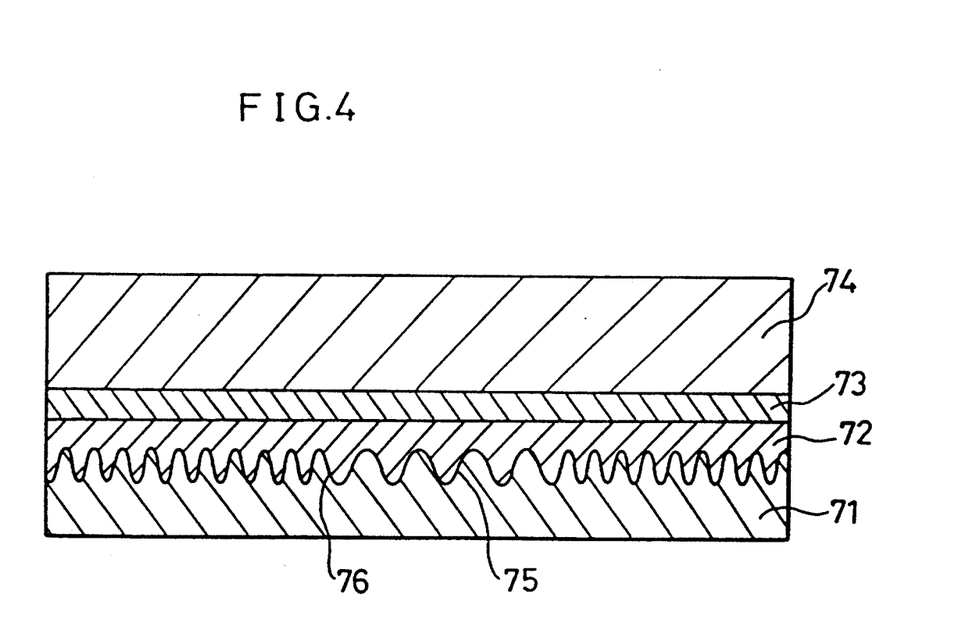
FIG. 4 is a cross-sectional view showing a semiconductor laser having a primary diffraction grating in the neighborhood of resonator facets and a secondary diffraction grating in the center of a resonator.

Similar to the semiconductor laser shown in FIG. 2, the semiconductor laser shown in FIG. 4 comprises primary and secondary diffraction gratings 76 and 75 formed on a substrate 71, in which a phase shift region is not formed in the center of the secondary diffraction grating 76. Referring to FIG. 4, a p type InGaAsP guide layer 72, an InGaAsP active layer 73 and an n type InP cladding layer 74 are sequentially formed on a p type InP substrate 71 where the primary and secondary diffraction gratings 76 and 75 are formed. In addition, electrodes and coating on facets are not shown.

The diffraction gratings are manufactured on the p type InP substrate 71 instead of the substrate 31 shown in FIG. 3 in accordance with a flow shown in FIGS. 3(a), 3(b), 3(d), and 3(e). More specifically, first, referring to FIG. 3(a), the resist (image reversible resist), which is baked at a temperature of 110° to 120° C. before exposure so that developing speed may have a minimum value at a certain exposure intensity, is applied to the substrate. Then, it is baked at a temperature of 110° to 120° C. Then, referring to FIG. 3(b), the substrate is covered at parts by the semi-transparent mask 43. The resist is exposed by the interference exposure method with an exposure intensity in which the maximum and minimum values of the exposure intensity are on both sides of the intensity which makes the developing speed α in a portion of the resist which is not covered with the semi-transparent mask 43 and exposed with an exposure intensity in which the maximum value of the exposure intensity is less than the intensity which makes the developing speed a minimum value in the parts covered with the semi-transparent mask 43. The width of the semi-transparent mask 43 and the distance between them are approximately 300 microns. Thereafter, the substrate is etched away using appropriate etchant to form the diffraction gratings 75 and 76. Then, the InGaAsP guide layer 72, the InGaAsP composition ratio of which permits the layer to have a band gap corresponding wavelength of 1.15 microns, the InGaAsP active layer 73, the InGaAsP composition ratio of which permits the layer to have a band gap corresponding wavelength of 1.3 microns, and the n type InP clad layer 74 are sequentially formed and then divided into chips in the center of the primary diffraction grating by cleaving. Thus, the DFB laser shown in FIG. 4 is completed.

Although the semiconductor laser having no phase shift region was described in the above embodiment, when a phase shift plate is introduced into the interference exposure apparatus, the phase shift region can be formed in the center of the element in accordance with the manufacturing method of the diffraction gratings in accordance with the present invention. As a result, the semiconductor laser device shown in FIG. 2 can be manufactured.

In addition, although the diffraction grating with a period of Λ is formed in a portion covered with the semi-transparent mask and a diffraction grating with the period of Λ/2 is formed in a portion not covered with the semi-transparent mask in the above embodiment, the same effect can be attained even if the whole surface of the resist on the substrate is exposed before or after the interference exposure so that the maximum value of the exposure intensity may be more than the point of α and the minimum value thereof may be less than the point of α in the portion covered with the semi-transparent mask and the minimum value of the exposure intensity may be more than the point α in the portion which is not covered with the mask.

As described above, according to the present invention, the method for manufacturing a diffraction grating comprises the steps of applying a resist, the developing speed of which has an extreme value for a certain exposure intensity, to a substrate where the diffraction grating is to be formed, performing interference exposure with an intensity having the maximum and minimum values respectively larger and smaller than the intensity which makes the developing speed an extreme value and etching the substrate using a pattern, which is obtained by developing the resist, as a mask. Thus, a diffraction grating pattern having, a period which is a half of an interference fringe period in an interference exposure method can be formed.

In addition, according to the present invention, since the order of the diffraction grating in the center is higher than that of the diffraction grating in the neighborhood of resonator facets in a semiconductor laser device having the diffraction grating in an active region, beam density is prevented from being increased in the center of the element and very high linearity between the beam output and injected current and high stability of single wavelength oscillation can be obtained.

In addition, according to the present invention, the method for manufacturing the diffraction gratings comprises the steps of applying a resist, the developing speed of which has an extreme value at a certain exposure intensity, to a substrate where the diffraction grating is to be formed, partially covering the resist with a semi-transparent mask, performing an interference exposure with maximum and minimum values of exposure intensity are respectively larger and smaller than the intensity which makes the developing sped an extreme value in either a portion covered with the semi-transparent mask or another portion and etching the substrate using a pattern, which is obtained by developing the resist, as a mask. As a result, two diffraction gratings having two different periods are formed simultaneously by one interference exposure and semiconductor laser having the primary and secondary diffraction gratings can be easily formed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a diffraction grating comprising:
  applying to a substrate in which a diffraction grating is to be formed a film of a light-sensitive resist having a developing rate that varies with the intensity of light to which the resist is exposed, the resist exhibiting a minimum developing rate upon exposure to a first intensity of light and higher developing rates upon exposure to light intensities exceeding and less than the first intensity;

exposing the resist film to light incident on the film in a pattern of interference fringes having a period, the pattern including light intensities exceeding and less than the first intensity;

developing the resist film; and etching the substrate using the developed resist film as a mask to produce a diffraction grating having a period smaller than the period of the pattern of interference fringes.

2. The method of claim 1 including exposing the resist film to the pattern of interference fringes including light intensities exceeding, equal to, and less than the first intensity, developing the resist film, and etching the substrate so that the period of the diffraction grating is one-half the period of the pattern of interference fringes.

3. The method of claim 1 including exposing the resist film to the pattern of interference fringes including light intensities exceeding, equal to, and less than the first intensity and developing the resist film so that portions of the resist film exposed to light having an intensity other than the first intensity are removed from the substrate.

4. A method of manufacturing a diffraction grating comprising:

applying to a substrate in which a diffraction grating is to be formed a film of a light-sensitive resist having a developing rate that varies with the intensity of light to which the resist is exposed, the resist exhibiting a maximum developing rate upon exposure to a first intensity of light and lower developing rates upon exposure to light intensities exceeding and less than the first intensity;

exposing the resist film to light incident on the film in a pattern of interference fringes having a period, the pattern including light intensities exceeding, equal to, and less than the first intensity;

developing the resist film; and etching the substrate using the developed resist film as a mask to produce a diffraction grating having a period smaller than the period of the pattern of interference fringes.

5. The method of claim 4 including exposing the resist film to the pattern of interference fringes including light intensities exceeding, equal to, and less than the first intensity, developing the resist film, and etching the substrate so that the period of the diffraction grating is one-half the period of the pattern of interference fringes.

6. The method of claim 4 including exposing the resist film to the pattern of interference fringes including light intensities exceeding, equal to, and less than the first intensity and developing the resist film so that portions of the resist film exposed to light having an intensity other than the first intensity remain in place on the substrate.

7. A method of manufacturing a diffraction grating comprising:

applying to a substrate in which a diffraction grating is to be formed a film of a light-sensitive resist having a developing rate that varies with the intensity of light to which the resist is exposed, the resist exhibiting a minimum developing rate upon exposure to a first intensity of light and higher developing rates upon exposure to light intensities exceeding and less than the first intensity;

covering at least one part of the resist film with a semi-transparent mask that attenuates incident light, leaving at least one part of the resist film uncovered;

exposing the resist film to light incident on the film in a pattern of interference fringes having a period, the pattern incident on the part of the resist film not covered by the semi-transparent mask having light intensities exceeding, equal to, and less than the first intensity;

removing the semi-transparent mask;

developing the resist film; and etching the substrate using the developed resist film as a mask to produce a diffraction grating including at least one part having a period smaller than the period of the pattern of interference fringes and at least one part having a period substantially the same as the period of the pattern of the interference fringes.

8. The method of claim 7 including exposing the part of the resist film not covered with the semi-transparent mask with the pattern of interference fringes including light intensities exceeding, equal to, and less than the first intensity, developing the resist film, and etching the substrate so that the period of the part of the diffraction grating having a period smaller than the period of the pattern of interference fringes is one-half the period of the pattern of interference fringes.

9. The method of claim 7 including exposing the resist film to the pattern of interference fringes including light intensities exceeding, equal to, and less than the first intensity and developing the resist film so that portions of the resist film exposed to light having an intensity other than the first intensity and removed from the substrate.

10. A method of manufacturing a diffraction grating comprising:

applying to a substrate in which a diffraction grating is to be formed a film of a light-sensitive resist having a developing rate that varies with the intensity of light to which the resist is exposed, the resist exhibiting a minimum developing rate upon exposure to a first intensity of light and lower developing rates upon exposure to light intensities exceeding and less than the first intensity;

covering at least one part of the resist film with a semi-transparent mask that attenuates incident light, leaving at least one part of the resist film uncovered;

exposing the resist film to light incident on the film in a pattern of interference fringes having a period, the pattern incident on the part of the resist film not covered by the semi-transparent mask having light intensities exceeding, equal to, and less than the first intensity;

removing the semi-transparent mask;

developing the resist film; and etching the substrate using the developed resist film as a mask to produce a diffraction grating including at least one part having a period smaller than the period of the pattern of interference fringes and at least one part having a period substantially the same as the period of the pattern of the interference fringes.

11. The method of claim 10 including exposing the part of the resist film not covered with the semi-transparent mask with the pattern of interference fringes including light intensities exceeding, equal to, and less than the first intensity, developing the resist film, and etching the substrate so that the period of the part of the diffraction grating having a period smaller than the period of the pattern of interference fringes is one-half the period of the pattern of interference fringes.

12. The method of claim 10 including exposing the resist film to the pattern of interference fringes including light intensities exceeding, equal to, and less than the first intensity and developing the resist film so that portions of the resist film exposed to light having an intensity other than the first intensity remain in place on the substrate.

* * * * *

UNITED STATES PATENT AND TRADEMARK OFFICE
CERTIFICATE OF CORRECTION

PATENT NO. : 5,238,785
DATED : August 24, 1993
INVENTOR(S) : Ohkura et al.

It is certified that error appears in the above-indentified patent and that said Letters Patent is hereby corrected as shown below:

Claim 9, column 10, line 38, change "and" to --are--.

Claim 10, column 10, line 45, change "minimum" to --maximum--.

Signed and Sealed this

Third Day of May, 1994

Attest:

BRUCE LEHMAN

Attesting Officer          Commissioner of Patents and Trademarks